United States Patent
Tominaga et al.

(10) Patent No.: US 12,550,268 B2
(45) Date of Patent: Feb. 10, 2026

(54) METHOD FOR MANUFACTURING CIRCUIT WIRING BY THREE-DIMENSIONAL ADDITIVE MANUFACTURING

(71) Applicant: FUJI CORPORATION, Chiryu (JP)

(72) Inventors: Ryojiro Tominaga, Okazaki (JP); Ryo Sakakibara, Anjo (JP); Tasuku Takeuchi, Kariya (JP); Yoshitaka Hashimoto, Kariya (JP); Kenji Tsukada, Toyota (JP)

(73) Assignee: FUJI CORPORATION, Chiryu (JP)

( * ) Notice: Subject to any disclaimer, the term of this patent is extended or adjusted under 35 U.S.C. 154(b) by 848 days.

(21) Appl. No.: 17/630,831

(22) PCT Filed: Jul. 31, 2019

(86) PCT No.: PCT/JP2019/029943
§ 371 (c)(1),
(2) Date: Jan. 27, 2022

(87) PCT Pub. No.: WO2021/019707
PCT Pub. Date: Feb. 4, 2021

(65) Prior Publication Data
US 2022/0279658 A1 Sep. 1, 2022

(51) Int. Cl.
*H05K 3/12* (2006.01)
*B33Y 10/00* (2015.01)
(Continued)

(52) U.S. Cl.
CPC ............ *H05K 3/1275* (2013.01); *H05K 1/03* (2013.01); *H05K 3/4644* (2013.01); *B33Y 10/00* (2014.12);
(Continued)

(58) Field of Classification Search
CPC .. H05K 3/1275; H05K 3/1283; H05K 3/1291; H05K 3/1241; H05K 3/125
See application file for complete search history.

(56) References Cited

U.S. PATENT DOCUMENTS

2007/0281091 A1* 12/2007 Kowalski ............. H05K 3/4664
427/256
2012/0205144 A1* 8/2012 Ozaki .................... H05K 3/125
174/254
(Continued)

FOREIGN PATENT DOCUMENTS

EP 3 219 467 A1 9/2017
JP 2010161251 A * 7/2010
(Continued)

OTHER PUBLICATIONS

International Search Report mailed on Oct. 15, 2019 in PCT/JP2019/029943 filed on Jul. 31, 2019, 2 pages.

*Primary Examiner* — Livius R. Cazan
(74) *Attorney, Agent, or Firm* — Oblon, McClelland, Maier & Neustadt, L.L.P.

(57) ABSTRACT

In a case where a circuit wiring is formed on a resin member by three-dimensional additive manufacturing, a method for manufacturing the circuit wiring by three-dimensional additive manufacturing capable of suppressing swelling or cracking of the circuit wiring is provided. A method for manufacturing a circuit wiring by three-dimensional additive manufacturing includes a discharging step of discharging a fluid containing a metal particle onto a resin member formed of a resin material; and a circuit wiring forming step of forming a circuit wiring by heating the fluid containing the metal particle discharged onto the resin member at a heating temperature to be cured, and the heating being performed at the heating temperature based on a glass
(Continued)

transition point of the resin material, a linear expansion coefficient of the resin material, and a room temperature.

2 Claims, 4 Drawing Sheets

(51) Int. Cl.
  *H05K 1/03* (2006.01)
  *H05K 3/46* (2006.01)
  *B33Y 80/00* (2015.01)
(52) U.S. Cl.
  CPC ...... *B33Y 80/00* (2014.12); *H05K 2203/0104* (2013.01)

(56) References Cited

U.S. PATENT DOCUMENTS

2016/0172625 A1* 6/2016 Mukai ................ H10K 50/8445
　　　　　　　　　　　　　　　　　　　　　428/447
2017/0280567 A1* 9/2017 Suzuki ................ B29C 67/0003

FOREIGN PATENT DOCUMENTS

| JP | 2017-183645 A | 10/2017 |
| WO | WO 2017/221347 A1 | 12/2017 |
| WO | WO 2019/102522 A1 | 5/2019 |

* cited by examiner

METHOD FOR MANUFACTURING CIRCUIT WIRING BY THREE-DIMENSIONAL ADDITIVE MANUFACTURING

TECHNICAL FIELD

The present disclosure relates to a method for manufacturing a circuit wiring by three-dimensional additive manufacturing.

BACKGROUND ART

Conventionally, various techniques have been proposed for three-dimensional additive manufacturing. For example, Patent Literature 1 discloses a technique of forming a laminate unit including an electronic component and a circuit wiring by three-dimensional additive manufacturing. In a laminate unit forming device described in Patent Literature 1, an insulating layer is formed by discharging an ultraviolet curable resin onto a base material and curing the resin. In the laminate unit forming device, after metal ink is discharged onto the insulating layer, the metal ink is irradiated with a laser to fire the metal ink, and a circuit wiring is formed.

PATENT LITERATURE

Patent Literature 1: International Publication No. WO2019/102522

BRIEF SUMMARY

Technical Problem

In the method for manufacturing the circuit wiring described above, heat is also applied to the insulating layer under the metal ink when the metal ink is fired. When the insulating layer is heated, the insulating layer expands in response to the linear expansion coefficient of the resin material constituting the insulating layer. As the insulating layer expands, there is a problem that a part of the circuit wiring formed on the insulating layer may be swollen or cracked.

Therefore, the present disclosure has been made in view of the above-described points, and an object thereof is to provide a method for manufacturing a circuit wiring by three-dimensional additive manufacturing capable of suppressing swelling and cracking of the circuit Therefore, the present disclosure has been made in view of the above-described points, and an object thereof is to provide a method for manufacturing a circuit wiring by three-dimensional additive manufacturing capable of suppressing swelling and cracking of the circuit wiring in a case where the circuit wiring is formed on a resin member by three-dimensional additive manufacturing.

Solution to Problem

According to an aspect of the present specification, there is disclosed a method for manufacturing a circuit wiring by three-dimensional additive manufacturing including a discharging step of discharging a fluid containing a metal particle onto a resin member formed of a resin material; and a circuit wiring forming step of forming a circuit wiring by heating the fluid containing the metal particle discharged onto the resin member at a heating temperature to be cured, and the heating being performed at the heating temperature based on a glass transition point of the resin material, a linear expansion coefficient of the resin material, and a room temperature.

Advantageous Effects

According to the present disclosure, the linear expansion coefficient of the resin material significantly changes before and after the glass transition point at which softening is initiated. Normally, the linear expansion coefficient equal to or higher than the glass transition point is rapidly increased as compared with the linear expansion coefficient equal to or lower than the glass transition point. In addition, as factors that affect the cracking or swelling of the circuit wiring, there are the glass transition point of the resin material forming the resin member, the linear expansion coefficient, the room temperature, and the heating temperature for heating the fluid containing the metal particle. Therefore, heating is performed using the heating temperature based on the glass transition point, the linear expansion coefficient, and the room temperature. As a result, the expansion of the resin member due to the heating in the circuit wiring forming step can be suppressed to a desired upper limit or lower, and swelling or cracking of the circuit wiring can be suppressed.

DESCRIPTION OF EMBODIMENTS

Hereinafter, preferred embodiments of the present disclosure will be described in detail with reference to the drawings.

(1) Configuration of Laminate Unit Forming Device

Figure 1:
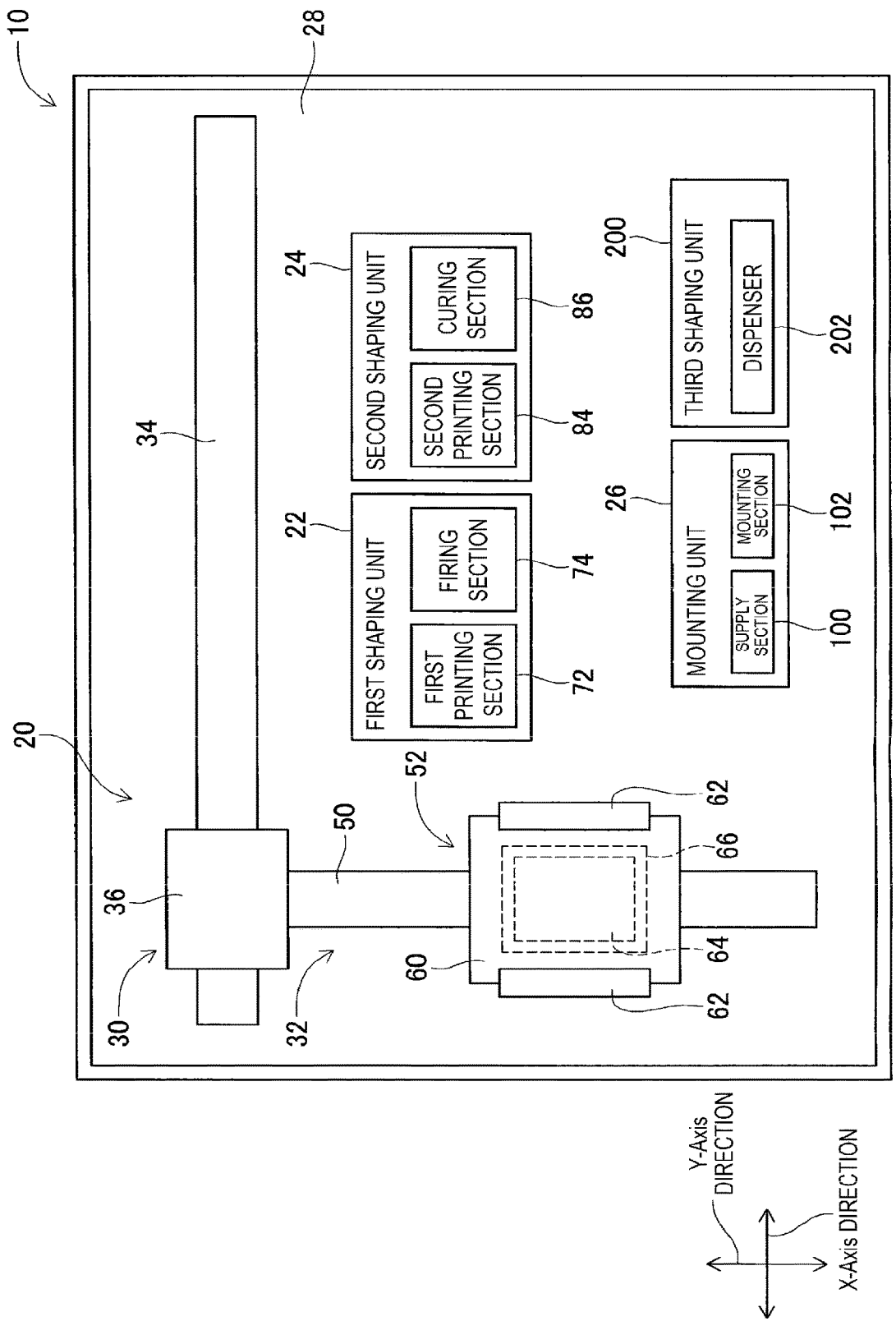
FIG. 1 is a diagram illustrating a laminate unit forming device.

FIG. 1 illustrates laminate unit forming device 10. Laminate unit forming device 10 is provided with conveyance device 20, first shaping unit 22, second shaping unit 24, mounting unit 26, third shaping unit 200, and control device 27 (refer to FIGS. 2 and 3). Conveyance device 20, first shaping unit 22, second shaping unit 24, mounting unit 26, and third shaping unit 200 are disposed on base 28 of laminate unit forming device 10. Base 28 has normally rectangular in a plan view. In the following description, a longitudinal direction of base 28 will be referred to as an X-axis direction, a shorter direction of base 28 will be referred to as a Y-axis direction, and a direction orthogonal to both of the X-axis direction and the Y-axis direction will be referred to as a Z-axis direction.

Conveyance device 20 is provided with X-axis slide mechanism 30 and Y-axis slide mechanism 32. X-axis slide mechanism 30 includes X-axis slide rail 34 and X-axis slider 36. X-axis slide rail 34 is disposed to extend in the X-axis direction on base 28. X-axis slider 36 is held by X-axis slide rail 34 to be slidable in the X-axis direction. Furthermore, X-axis slide mechanism 30 includes electromagnetic motor

38 (refer to FIG. 2) and moves X-axis slider 36 to any position in the X-axis direction by driving electromagnetic motor 38. In addition, Y-axis slide mechanism 32 includes Y-axis slide rail 50 and stage 52. Y-axis slide rail 50 is disposed to extend in the Y-axis direction on base 28. One end portion of Y-axis slide rail 50 is connected to X-axis slider 36. Therefore, Y-axis slide rail 50 is movable in the X-axis direction. Stage 52 is held by Y-axis slide rail 50 so as to be slidable in the Y-axis direction. Y-axis slide mechanism 32 includes electromagnetic motor 56 (refer to FIG. 2) and moves stage 52 to any position in the Y-axis direction by driving electromagnetic motor 56. As a result, by driving X-axis slide mechanism 30 and Y-axis slide mechanism 32, stage 52 is moved to any position on base 28.

Stage 52 includes base plate 60, holding device 62, lifting and lowering device 64, and cooling device 66. Base plate 60 is formed in a flat plate shape, and base material 70 (refer to FIG. 4) is placed on an upper surface thereof. Holding device 62 is provided on both side portions of base plate 60 in the X-axis direction. Holding device 62 fixedly holds base material 70 with respect to base plate 60 by interposing both edge portions in the X-axis direction of base material 70 placed on base plate 60. In addition, lifting and lowering device 64 is disposed below base plate 60, and lifts and lowers base plate 60 in the Z-axis direction.

In addition, cooling device 66 is a device for cooling base material 70 placed on base plate 60. The configuration of cooling device 66 is not particularly limited, and, for example, a gas cooling device using gas as a refrigerant, a liquid cooling device using liquid as a refrigerant, a device using a heat pipe, or the like can be employed. Cooling device 66 is driven based on the control of control device 27 (refer to FIG. 2) to cool base material 70, and thus the shaped object formed on base material 70 is cooled.

First shaping unit 22 is a unit for shaping a circuit wiring on base material 70 placed on base plate 60 of stage 52, and includes first printing section 72 and firing section 74. First printing section 72 includes ink jet head 76 (refer to FIG. 2) and linearly discharges metal ink onto base material 70 placed on base plate 60. The metal ink is an example of a fluid containing metal particles of the present disclosure. The metal ink is, for example, one in which fine particles of a metal (such as silver) having a nanometer size are dispersed in a solvent, and is cured by firing with heat. The surface of the metal fine particle is coated with, for example, a dispersant to suppress aggregation in the solvent. Ink jet head 76 discharges the metal ink from multiple nozzles, for example by a piezo method using a piezoelectric element. In addition, the device for discharging a fluid containing metal particles is not limited to an ink jet head including multiple nozzles, and may be, for example, a dispenser including one nozzle. In addition, the type of metal included in the metal ink is not limited to silver, and may be copper, gold, or the like. In addition, the number of types of metals included in the metal ink is not limited to one type, and may be multiple types.

Figure 2:
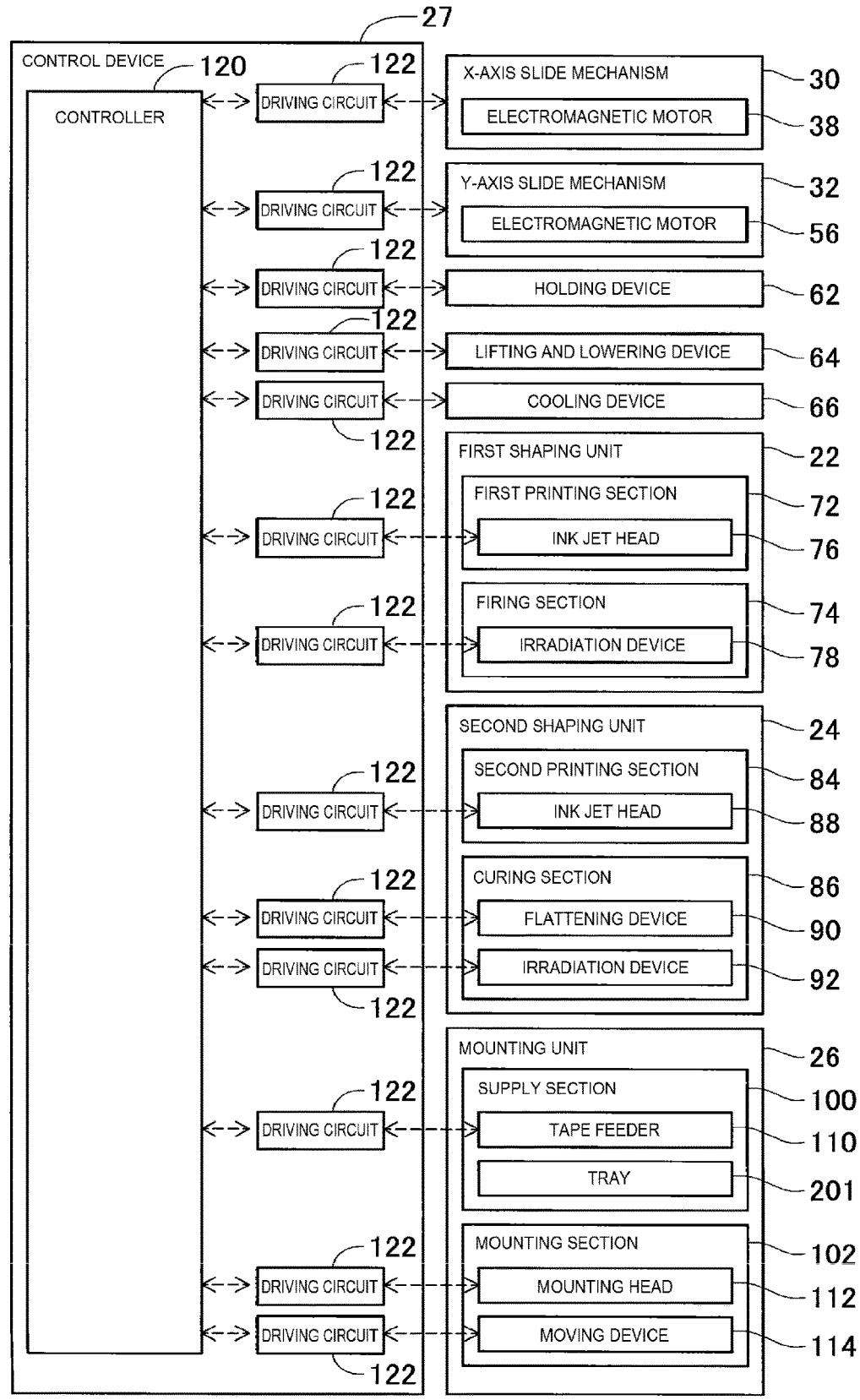
FIG. 2 is a block diagram illustrating a control device.

Firing section 74 includes irradiation device 78 (refer to FIG. 2). Irradiation device 78 is provided with, for example, an infrared heater that heats the metal ink discharged onto base material 70. The metal ink is fired by applying heat from the infrared heater to form a circuit wiring. The firing of the metal ink referred to herein means, for example, a phenomenon in which by applying energy, a solvent is vaporized or a protective film of the metal fine particles, that is, a dispersant is decomposed, and the metal fine particles are brought into contact with each other or fused to increase the conductivity. A circuit wiring can be formed by firing the metal ink. The device for heating the metal ink is not limited to the infrared heater. For example, laminate unit forming device 10 may be provided with an infrared lamp, a laser irradiation device that irradiates the metal ink with laser light, or an electric furnace in which base material 70 from which the metal ink is discharged is placed in a furnace and heated as a device for heating the metal ink. In addition, the temperature at which the metal ink is heated is not limited to, for example, the temperature of firing lower than the melting point of the metal included in the metal ink, and may be the temperature higher than the melting point of the metal.

In addition, second shaping unit 24 is a unit for shaping an insulating layer (one example of the resin member of the present disclosure) on base material 70 placed on base plate 60, and includes second printing section 84 and curing section 86. Second printing section 84 includes ink jet head 88 (refer to FIG. 2), and discharges an ultraviolet curable resin onto base material 70 placed on base plate 60. The ultraviolet curable resin is a resin that is cured by irradiation with ultraviolet rays. A method by which ink jet head 88 discharges the ultraviolet curable resin may be, for example, a piezo method using a piezoelectric element, or may be a thermal method in which the resin is heated to generate air bubbles and discharged from multiple nozzles.

Curing section 86 includes flattening device 90 (refer to FIG. 2) and irradiation device 92 (refer to FIG. 2). Flattening device 90 is a device for flattening an upper surface of the ultraviolet curable resin discharged onto base material 70 by ink jet head 88. Flattening device 90 makes the thickness of the ultraviolet curable resin uniform, for example, by scraping off excess resin by a roller or a blade while leveling the surface of the ultraviolet curable resin. In addition, irradiation device 92 is provided with a mercury lamp or LED as a light source, and irradiates the ultraviolet curable resin discharged onto base material 70 with ultraviolet rays. As a result, the ultraviolet curable resin discharged onto base material 70 is cured, and an insulating layer can be formed.

In addition, mounting unit 26 is a unit for mounting an electronic component or a probe pin on base material 70 placed on base plate 60, and includes supply section 100 and mounting section 102. Supply section 100 includes multiple tape feeders 110 (refer to FIG. 2) for feeding the taped electronic components one by one, and supplies the electronic components at each supply position. Furthermore, supply section 100 includes tray 201 (refer to FIG. 2) in which probe pins are disposed in a standing state, and supplies the probe pins in a state capable of being picked up from tray 201. The electronic component is, for example, a sensor element such as a temperature sensor. In addition, the probe pin is a member that electrically connects the circuit wirings of one laminate unit and the circuit wirings of other laminate units. The supply of the electronic components is not limited to the supply by tape feeder 110, and may be performed by a tray. In addition, the supply of the probe pins is not limited to the supply by tray 201, and may be performed by a tape feeder. In addition, the supply of the electronic components and the probe pins may be performed by both the supply by the tape feeder and the supply by the tray, or may be performed by other supplies.

Mounting section 102 includes mounting head 112 (refer to FIG. 2) and moving device 114 (refer to FIG. 2). Mounting head 112 includes a suction nozzle for picking up and holding an electronic component or a probe pin. The suction nozzle picks up and holds the electronic component or the like by suction of air by supplying a negative pressure from a positive and negative pressure supply device (not illustrated). The electronic component or the like is separated by supplying a slight positive pressure from the positive and negative pressure supplying device. In addition, moving device 114 moves mounting head 112 between the supply position of tape feeder 110 or tray 201 and base material 70 placed on base plate 60. As a result, mounting section 102 holds the electronic component or the like by the suction nozzle, and disposes the electronic component or the like held by the suction nozzle on base material 70.

Third shaping unit 200 is a unit for discharging a conductive adhesive onto base material 70 placed on base plate 60. The conductive adhesive is a conductive paste that is cured by heating, and is used, for example, for forming a through-hole for connecting circuit wirings or for electrically connecting (fixing) terminals of electronic components. Third shaping unit 200 includes dispenser 202 (refer to FIG. 3) as a device for discharging the conductive adhesive. The device for discharging the conductive adhesive or the like is not limited to the dispenser, and may be a screen printing device or a gravure printing device.

Dispenser 202 discharges a conductive adhesive into the through-hole of the insulating layer, the surface of the insulating layer, or the like. The conductive adhesive filled in the through-hole is heated and cured, for example, by firing section 74 of first shaping unit 22, and thus the through-hole is formed. In addition, the conductive adhesive discharged onto the surface of the insulating layer is heated and cured, for example, by firing section 74, and thus the terminals and the circuit wirings of the electronic components disposed by mounting head 112 are connected to each other.

Figure 3:
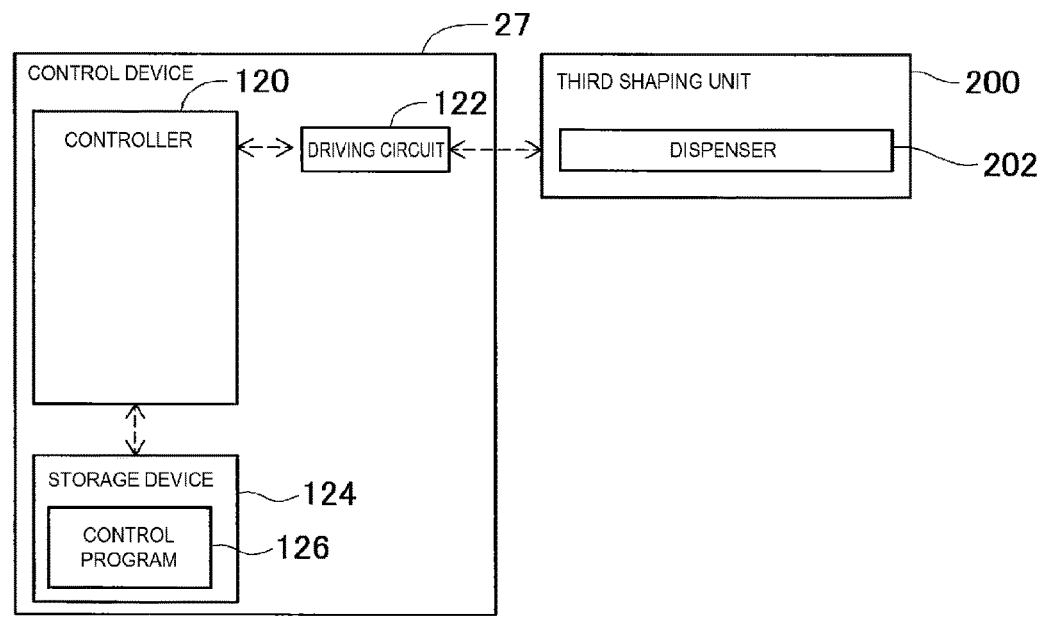
FIG. 3 is a block diagram illustrating the control device.

In addition, as illustrated in FIGS. 2 and 3, control device 27 is provided with controller 120, multiple drive circuits 122, and storage device 124. As illustrated in FIG. 2, multiple drive circuits 122 are connected to electromagnetic motors 38 and 56, holding device 62, lifting and lowering device 64, cooling device 66, ink jet head 76, irradiation device 78, ink jet head 88, flattening device 90, irradiation device 92, tape feeder 110, mounting head 112, and moving device 114. Furthermore, as illustrated in FIG. 3, drive circuit 122 is connected to third shaping unit 200 described above. Controller 120 is provided with CPU, ROM, RAM, and the like, is mainly a computer, and is connected to multiple drive circuits 122. Storage device 124 is provided with RAM, ROM, a hard disk, and the like, and stores control program 126 for controlling laminate unit forming device 10. Controller 120 can control the operations of conveyance device 20, first shaping unit 22, second shaping unit 24, mounting unit 26, third shaping unit 200, and the like by executing control program 126 with CPU. In the following description, the fact that controller 120 executes control program 126 to control each device may be simply referred to as a "device". For example, the fact that "controller 120 moves base plate 60" means that "controller 120 executes control program 126, controls the operation of conveyance device 20 via drive circuit 122, and moves base plate 60 by the operation of conveyance device 20".

(2) Method for Manufacturing Three-Dimensional Laminate Electronic Device

Laminate unit forming device 10 of the present embodiment manufactures a three-dimensional laminate electronic device by shaping multiple laminate units including circuit wirings and electronic components according to the above configuration, and assembling the multiple laminate units. Specifically, controller 120 controls first shaping unit 22 and cures the metal ink to form the circuit wiring. In addition, controller 120 controls second shaping unit 24 and cures the ultraviolet curable resin to form the insulating layer. Controller 120 can form a laminate unit having any shape by changing the shape of the circuit wiring or the insulating layer.

In addition, controller 120 mounts the electronic component by mounting unit 26 in the process of shaping the laminate unit. For example, three-dimensional data of each layer obtained by slicing the laminate unit is set in control program 126. Controller 120 discharges and cures the ultraviolet curable resin based on the data of control program 126 to form a laminate unit. In addition, controller 120 detects information such as a layer or a position where the electronic component is disposed based on the data of control program 126, and mounts the electronic component on the laminate unit based on the detected information. In addition, controller 120 executes the mounting of the probe pin supplied from mounting unit 26 or the shaping with the conductive adhesive discharged from dispenser 202 of third shaping unit 200 on the laminate unit based on the data of control program 126. A desired three-dimensional laminate electronic device can be manufactured by assembling the multiple laminate units shaped in this manner. The method of fixing multiple laminate units to each other is not particularly limited, and a method using a screw, a bolt, a nut, or the like, or a method using an adhesive can be employed. In addition, the work for assembling multiple laminate units may be automatically executed by laminate unit forming device 10. For example, laminate unit forming device 10 may be provided with a robot arm that assembles and fixes multiple laminate units to each other. Alternatively, the work for assembling multiple laminate units may be performed manually by the user.

Figure 4:
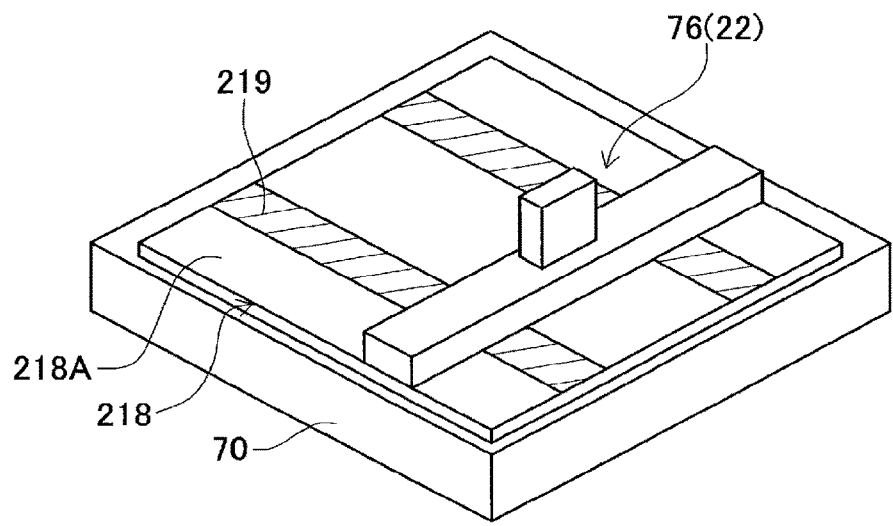
FIG. 4 is a view illustrating a discharging step.

Next, an example of a discharging step of discharging metal ink and a circuit wiring forming step of curing the discharged metal ink to form a circuit wiring in the manufacturing step described above will be described. FIG. 4 illustrates the discharging step. For example, controller 120 controls conveyance device 20 (refer to FIG. 1), and moves stage 52 on which base material 70 is set below second shaping unit 24 (refer to FIG. 1). Controller 120 controls ink jet head 88 of second shaping unit 24 to discharge the ultraviolet curable resin onto base material 70 (one example of the second discharging step of the present disclosure). Controller 120 controls irradiation device 92 to irradiate the ultraviolet curable resin discharged onto base material 70 with ultraviolet rays to cure the ultraviolet curable resin (one example of the curing step of the present disclosure). Controller 120 repeatedly executes discharging and curing to form insulating layer 218 (refer to FIG. 4) on base material 70 (one example of the insulating layer forming step of the present disclosure).

When insulating layer 218 having a desired thickness or shape is formed, controller 120 controls conveyance device 20, and moves stage 52 on which base material 70 is set below first shaping unit 22 (refer to FIG. 1). As illustrated in FIG. 4, controller 120 controls ink jet head 76 of first shaping unit 22 to discharge metal ink 219 in a thin film form onto upper surface 218A of insulating layer 218. Controller 120 discharges metal ink 219 based on three-dimensional data of control program 126 (data of the circuit wiring).

Figure 5:
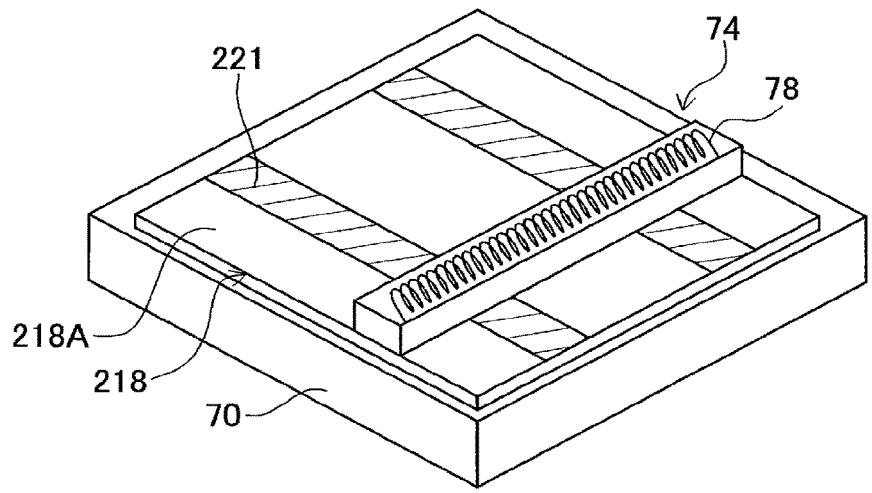
FIG. 5 is a view illustrating a circuit wiring forming step.

As illustrated in FIG. 5, controller 120 heats and fires metal ink 219 discharged to upper surface 218A by irradiation device 78 of firing section 74. For example, controller 120 repeatedly executes the discharging step illustrated in FIG. 4 and the circuit wiring forming step illustrated in FIG. 5 to form desired circuit wiring 221. Desired circuit wiring 221 referred to herein is circuit wiring 221 that satisfies a desired thickness, shape, or electrical characteristics.

Here, in the circuit wiring forming step described above, heat is applied to insulating layer 218 when metal ink 219 discharged onto insulating layer 218 is heated by irradiation device 78 of firing section 74. Insulating layer 218 expands in response to the linear expansion coefficient of the ultraviolet curable resin constituting insulating layer 218 by heating. As a result, a part of circuit wiring 221 may be swollen or cracked (crack may occur). In particular, in insulating layer 218 having a three-dimensional structure, the scale of thermal expansion is increased as compared with a thin object such as a resin film, and swelling or the like of circuit wiring 221 becomes more problematic. Therefore, laminate unit forming device 10 of the present embodiment suppresses the occurrence of the swelling or the like of circuit wiring 221 by changing the condition that affects the swelling or the cracking of circuit wiring 221.

Figure 6:
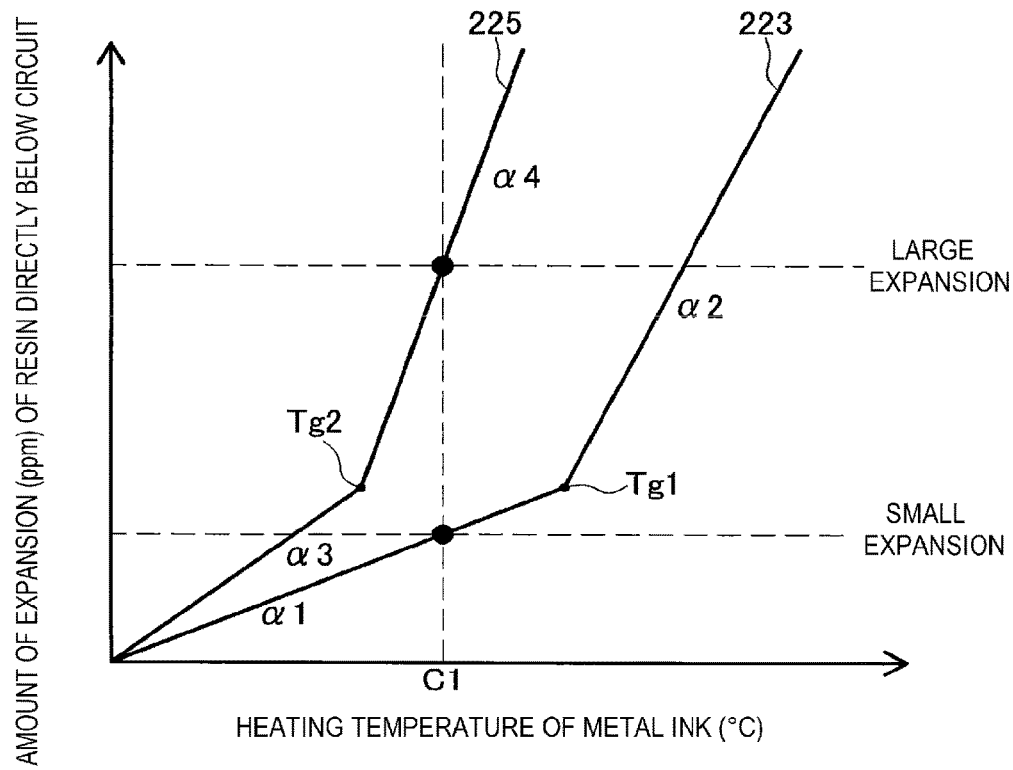
FIG. 6 is a graph illustrating a relationship between a linear expansion coefficient and a glass transition point of two types of ultraviolet curable resins.

FIG. 6 illustrates the relationship between the linear expansion coefficient and the glass transition point of two types of ultraviolet curable resins. The horizontal axis in FIG. 6 represents the heating temperature (° C.) of metal ink 219. Heating temperature C1 is, for example, a firing temperature at which the metal ink is fired. In addition, the vertical axis in FIG. 6 represents the amount of expansion (ppm) of the resin directly below circuit wiring 221, and represents, for example, the amount of expansion of a portion of insulating layer 218 where the temperature is raised most due to firing. In addition, the glass transition point is, for example, the temperature at which the temperature changes from a hard state to a soft rubber shape.

First resin material 223 illustrated in FIG. 6 is an ultraviolet curable resin having glass transition point $Tg1$ higher than heating temperature C1. The inclination of the graph in FIG. 6 represents the linear expansion coefficient. Second linear expansion coefficient $a2$ of first resin material 223 having glass transition point $Tg1$ or higher is rapidly increased as compared with first linear expansion coefficient $a1$ of first resin material 223 having glass transition point $Tg1$ or lower.

In addition, second resin material 225 is an ultraviolet curable resin having glass transition point $Tg2$ lower than heating temperature C1. Similar to first resin material 223, second linear expansion coefficient $a4$ of second resin material 225 having glass transition point $Tg1$ or higher is rapidly increased as compared with first linear expansion coefficient $a3$ of second resin material 225 having glass transition point $Tg1$ or lower.

As factors that affect swelling or the like of circuit wiring 221, there are various factors such as the temperature in the room where laminate unit forming device 10 is disposed, in addition to heating temperature C1, the linear expansion coefficient ($a1$ or the like), and the glass transition points ($Tg1$ and $Tg2$) described above. As a result of performing various simulations and experiments, the inventors have found that it is possible to significantly effectively suppress swelling or cracking of circuit wiring 221 by setting the following conditional expressions.

(2-1) In a Case where Heating Temperature C1≤Glass Transition Point $Tg1$

In a case where the resin material such as first resin material 223 having glass transition point $Tg1$ higher than heating temperature C1 is used, swelling or the like of circuit wiring 221 can be effectively suppressed by using heating temperature C1 satisfying the following expression.

(Heating temperature C1−Room temperature)×First linear expansion coefficient $a1$<Upper limit value    (Expression 1)

The room temperature of expression 1 is the temperature of the room where laminate unit forming device 10 is installed. That is, the room temperature is the temperature of an environment in which circuit wiring 221 is shaped. In addition, the upper limit value is a value indicating an upper limit of the expansion of insulating layer 218 by the heating in the circuit wiring forming step, and is preferably, for example, 6000 ppm.

For example, the upper limit value can be set to a value that is an upper limit of the expansion of insulating layer 218 in which no swelling or cracking occurs in circuit wiring 221 to be manufactured. More specifically, the upper limit value can be set by performing simulation or manufacture of a prototype in advance, and measuring the expansion coefficient of insulating layer 218 in a case where swelling or cracking occurs in circuit wiring 221. Alternatively, even when swelling or cracking has occurred, the upper limit of the expansion of insulating layer 218 in a range where circuit wiring 221 satisfies desired performance (resistance value or high-frequency characteristic) may be set as the upper limit value. That is, an upper limit value of a range allowing fine swelling or cracking may be set. In addition, the upper limit value can be set to an appropriate value in accordance with the type of resin material to be used, the type of the metal ink, the structure of the laminate unit, and the like. For example, the upper limit value is changed in accordance with the ease of elongation of metal ink 219, the rigidity of the ultraviolet curable resin, or the like.

Accordingly, the upper limit value in the present embodiment can be set to the amount of expansion by which insulating layer 218 (one example of the resin member of the present disclosure) expands by heating in the circuit wiring forming step and the amount of expansion indicating an upper limit of a range where swelling and cracking do not occur in circuit wiring 221. As a result, heating can be performed in a range where swelling or cracking of circuit wiring 221 does not occur, and circuit wiring 221 satisfying desired electrical characteristics can be manufactured by three-dimensional additive manufacturing.

Controller 120 of the present embodiment performs heating in the circuit wiring forming step at heating temperature C1 satisfying the above expression 1. As a result, as the resin material, a material whose glass transition point $Tg1$ is higher than heating temperature C1 for forming circuit wiring 221 is employed. By using heating temperature C1 satisfying the above expression (1), the expansion of insulating layer 218 can be suppressed, and swelling or cracking of circuit wiring 221 can be suppressed.

Specifically, for example, first linear expansion coefficient $a1$ of the ultraviolet curable resin (first resin material 223) used to shape insulating layer 218 and heating temperature C1 in response to the room temperature of the use environment are set in advance in control program 126. Controller 120 controls the current value to flow to the infrared heater of irradiation device 78, for example, with heating temperature C1 as the target temperature. For example, a temperature sensor for measuring the temperature of insulating layer 218 may be provided in irradiation device 78, and controller 120 may execute feedback control based on the temperature detected by the temperature sensor and the target temperature. As a result, heating temperature C1 can be managed by controller 120, and swelling or the like of circuit wiring 221 can be suppressed.

In addition, laminate unit forming device 10 may be provided with a temperature sensor for measuring the room temperature. Controller 120 may automatically set heating temperature C1 based on the room temperature and first linear expansion coefficient $\alpha 1$ detected by the temperature sensor. In addition, controller 120 may control other factors that affect the swelling or the like of circuit wiring 221. For example, controller 120 may control the distance and the heating time between irradiation device 78 and metal ink 219 to suppress an increase in the temperature of insulating layer 218.

(2-2) In a Case where Heating Temperature C1>Glass Transition Point Tg2

In a case where a resin material having glass transition point Tg2 lower than heating temperature C1, such as second resin material 225, is used, swelling or the like of circuit wiring 221 can be effectively suppressed by using heating temperature C1 satisfying the following expression.

(Glass transition point $Tg2$–Room temperature)×First linear expansion coefficient $\alpha 3$+(Heating temperature C1–Glass transition point $Tg2$)×Second linear expansion coefficient $\alpha 4$<Upper limit value  (Expression 2)

The upper limit value is a value indicating an upper limit of the expansion of insulating layer 218 by the heating in the circuit wiring forming step, and is preferably, for example, 6000 ppm. The upper limit value of (expression 2) can be set to an appropriate value in accordance with the type of resin material to be used, or the like, similarly to the upper limit value of (expression 1). In addition, the upper limit value of (expression 1) and the upper limit value of (expression 2) may be different from each other.

In a case where second resin material 225 is used, controller 120 of the present embodiment performs heating in the circuit wiring forming step at heating temperature C1 satisfying the above expression 2. As a result, as the resin material, a material having glass transition point Tg2 lower than heating temperature C1 for forming circuit wiring 221 is employed. By using heating temperature C1 satisfying the above (expression 2), the expansion of insulating layer 218 can be suppressed, and swelling or cracking of circuit wiring 221 can be suppressed.

Similar to the case (2-1) described above, controller 120 can control the infrared heater of irradiation device 78 to control heating temperature C1 in response to the target temperature set in control program 126. In addition, as described above, in a normal resin material, the linear expansion coefficient rapidly increases when the softening is initiated in a state of the glass transition point or higher. Therefore, even when the ultraviolet curable resin has heating temperature C1>glass transition point Tg2, it may be necessary to increase the upper limit value of the above-described (expression 2) in order to secure heating temperature C1 necessary for firing the metal ink. In such a case, controller 120 of the present embodiment can drive cooling device 66 (refer to FIG. 2) to cool base material 70, and can effectively suppress the occurrence of swelling or cracking of circuit wiring 221.

For example, in the circuit wiring forming step illustrated in FIG. 5, controller 120 may drive cooling device 66 to cool base material 70, and may suppress an increase in the temperature of insulating layer 218. As a result, it is possible to suppress an increase in the temperature of insulating layer 218 and to suppress the expansion of insulating layer 218. In particular, in a case where glass transition point Tg2 is lower than heating temperature C1, the expansion of insulating layer 218 due to the heating can be suppressed, and the swelling or cracking of circuit wiring 221 can be effectively suppressed. Controller 120 may perform cooling by cooling device 66 even in a case where first resin material 223 has heating temperature C1≤glass transition point Tg1 of (2-1) described above. As a result, it is possible to more reliably suppress swelling or the like of circuit wiring 221. In addition, controller 120 may not perform cooling by cooling device 66 in a case where second resin material 225 has heating temperature C1≥glass transition point Tg2.

(3) SUMMARY

As described in detail above, the method for manufacturing circuit wiring 221 of the present embodiment includes the discharging step of FIG. 4 in which metal ink 219 is discharged onto insulating layer 218, and the circuit wiring forming step of FIG. 5 in which metal ink 219 discharged onto insulating layer 218 is heated and cured at heating temperature C1 to form circuit wiring 221. In the circuit wiring forming step in FIG. 5, heating is performed at heating temperature C1 based on glass transition points Tg1 and Tg2 of the ultraviolet curable resin, first linear expansion coefficient $\alpha 1$, first linear expansion coefficient $\alpha 3$, second linear expansion coefficient $\alpha 4$, and the room temperature.

The linear expansion coefficient of the resin material significantly changes before and after glass transition points Tg1 and Tg2 at which the softening is initiated. Normally, the linear expansion coefficients (second linear expansion coefficients $\alpha 2$ and $\alpha 4$) of glass transition points Tg1 and Tg2 or higher is rapidly increased as compared with the linear expansion coefficients (first linear expansion coefficients $\alpha 1$ and $\alpha 3$) of glass transition points Tg1 and Tg2 or lower. In addition, as factors that affect the cracking or swelling of circuit wiring 221, there are glass transition points Tg1 and Tg2, a linear expansion coefficient, room temperature, and heating temperature C1 of metal ink 219. Therefore, heating is performed using glass transition points Tg1 and Tg2, the linear expansion coefficient, and heating temperature C1 based on the room temperature. As a result, the expansion of insulating layer 218 due to the heating in the circuit wiring forming step can be suppressed to a desired upper limit or lower, and swelling or cracking of circuit wiring 221 can be suppressed.

Incidentally, in the present embodiment, first resin material 223 and second resin material 225 are an example of resin materials. Insulating layer 218 is an example of a resin member. Metal ink 219 is an example of a fluid containing metal particles.

(4) Modification Example

The present disclosure is not limited to the above-described embodiment, and various modifications can be made within the scope not departing from the concept of the present disclosure. For example, the resin constituting insulating layer 218 is not limited to an ultraviolet curable resin, and may be, for example, a thermoplastic resin or a thermosetting resin. In addition, in the above embodiment, laminate unit forming device 10 formed insulating layer 218 in which the ultraviolet curable resin was cured as the resin material of the present disclosure by three-dimensional additive manufacturing. However, laminate unit forming device 10 may form circuit wiring 221 on a resin material formed by a method other than the three-dimensional additive manufacturing (injection molding or the like). The configuration of laminate unit forming device 10 described above is an example, and can be appropriately changed. For example, laminate unit forming device 10 may not be provided with mounting unit 26 or mounting section 102 for mounting electronic components. In addition, laminate unit forming device 10 may not be provided with cooling device 66. In addition, in the above embodiment, laminate unit forming device 10 has a configuration capable of performing shaping with two types of resins, that is, first resin material 223 and second resin material 225, and may have a configuration capable of performing shaping with only either of the resins.

REFERENCE SIGNS LIST 70 base material, 218 insulating layer (resin material), 219 metal ink (fluid containing metal particles), 221 circuit wiring, 223 first resin material (resin material), 225 second resin material (resin material), Tg1, Tg2 glass transition point, α1 first linear expansion coefficient, α2 second linear expansion coefficient, α3 first linear expansion coefficient, α4 second linear expansion coefficient

The invention claimed is:

1. A method for manufacturing a circuit wiring by three-dimensional additive manufacturing comprising:
a first discharging step of discharging a resin material onto a base material;
a curing step of curing the resin material discharged onto the base material;
an insulating layer forming step of repeatedly executing the first discharging step and the curing step to form an insulating layer as a resin member;
a second discharging step of discharging a fluid containing a metal particle onto the resin member formed of the resin material;
a circuit wiring forming step of forming a circuit wiring by heating the fluid containing the metal particle discharged onto the resin member at a heating temperature to be cured while cooling the base material, the heating being performed at the heating temperature based on a glass transition point of the resin material, a linear expansion coefficient of the resin material, and a room temperature, wherein
the resin material is a material having the glass transition point lower than the heating temperature, and
in the circuit wiring forming step, the heating is performed at the heating temperature satisfying the following expression (glass transition point−room temperature)×first linear expansion coefficient+(heating temperature−glass transition point)×second linear expansion coefficient<upper limit value where the first linear expansion coefficient is the linear expansion coefficient at the glass transition point or lower, the second linear expansion coefficient is the linear expansion coefficient at the glass transition point or higher, the second linear expansion coefficient being greater than the first linear expansion coefficient, and the upper limit value indicates an upper limit of expansion of the resin member by the heating in the circuit wiring forming step.

2. The method for manufacturing a circuit wiring by three-dimensional additive manufacturing according to claim 1, wherein
the upper limit value indicating the upper limit of expansion of the resin member by the heating in the circuit wiring forming step is an amount of expansion by which the resin member expands by the heating in the circuit wiring forming step, and an amount of expansion indicating an upper limit of a range where no swelling or cracking occurs in the circuit wiring.

* * * * *